(12) United States Patent
Hartmann

(10) Patent No.: US 7,284,318 B2
(45) Date of Patent: Oct. 23, 2007

(54) APPARATUS FOR MOUNTING SEMICONDUCTOR CHIPS

(75) Inventor: Dominik Hartmann, Hagendorn (CH)

(73) Assignee: ESEC, Trading SA, Cham (CH)

( * ) Notice: Subject to any disclaimer, the term of this patent is extended or adjusted under 35 U.S.C. 154(b) by 649 days.

(21) Appl. No.: 10/313,183

(22) Filed: Dec. 5, 2002

(65) Prior Publication Data
US 2003/0101576 A1    Jun. 5, 2003

(30) Foreign Application Priority Data
Dec. 5, 2001    (CH) .................................. 2241/01

(51) Int. Cl.
*B23P 19/00*    (2006.01)
(52) U.S. Cl. ............................ 29/740; 29/739; 29/741; 29/832; 29/840; 901/40; 294/64.1; 414/737; 414/751.1; 414/752.1
(58) Field of Classification Search .................. 29/739, 29/740, 741, 832, 840; 901/40; 294/64.1; 414/737, 751.1, 752.1
See application file for complete search history.

(56) References Cited

U.S. PATENT DOCUMENTS

| | | | | |
|---|---|---|---|---|
| 4,628,576 A | * | 12/1986 | Giachino et al. | 29/890.128 |
| 4,632,018 A | * | 12/1986 | Lymburner | 92/5 R |
| 5,308,132 A | * | 5/1994 | Kirby et al. | 294/64.1 |
| 5,351,872 A | | 10/1994 | Kobayashi | |
| 5,741,114 A | * | 4/1998 | Onodera | 414/783 |
| 6,185,815 B1 | * | 2/2001 | Schindler | 29/740 |
| 6,328,362 B1 | * | 12/2001 | Isogai et al. | 294/64.1 |

FOREIGN PATENT DOCUMENTS

| | | |
|---|---|---|
| EP | 0 923 111 A2 | 11/1998 |
| EP | 1 143 489 A1 | 3/2001 |
| JP | 64-41230 | 8/1987 |
| JP | 08330790 | 5/1995 |
| JP | 10209687 | 1/1997 |
| JP | 10340931 | 6/1997 |
| JP | 11260840 | 1/1999 |

OTHER PUBLICATIONS

European Search Report.

* cited by examiner

*Primary Examiner*—Richard Chang
(74) *Attorney, Agent, or Firm*—Thelen Reid Brown Raysman & Steiner LLP

(57) ABSTRACT

An apparatus for mounting semiconductor chips has a pick and place system arranged stationary in vertical direction for the picking, transport and placement of a semiconductor chip onto a substrate. The pick and place system comprises a bondhead with a chip gripper deflectable relative to the bondhead. The deflection of the chip gripper takes place by means of a pneumatic drive arranged on the bondhead which has two pressure chambers separated by a piston, whereby the chip gripper is secured to the piston. The pressure $p_1$ prevailing in the first pressure chamber and the pressure $p_2$ prevailing in the second pressure chamber are dynamically controlled by means of a regulator controlled valve system. The regulator can be operated in two operating modes. In the first operating mode, the deflection of the chip gripper and/or a variable derived from it is controlled based on the signal delivered by a position encoder which measures the deflection of the chip gripper. In the second operating mode, the pressure $p_1$ and/or the pressure $p_2$ and/or the pressure differential $p_1$-$p_2$ is controlled.

12 Claims, 3 Drawing Sheets

APPARATUS FOR MOUNTING SEMICONDUCTOR CHIPS

PRIORITY CLAIM

The present application claims priority under 35 U.S.C § 119 based upon Swiss Patent Application No. 2001 2241/01 filed on Dec. 5, 2001.

FIELD OF THE INVENTION

The invention concerns an apparatus, i.e. an automatic assembly machine, for mounting semiconductor chips.

BACKGROUND OF THE INVENTION

Such automatic assembly machines are also referred to as Die Bonders. A Die Bonder comprises an apparatus referred to as a pick and place system which comprises a bondhead with a chip gripper in order to mount the numerous, uniform semiconductor chips of a wafer, which are located next to each other on a carrier foil, one after the other onto a substrate, eg, a metallic leadframe. A pick and place system is known from the European patent application EP 923 111 with which the bondhead is guided back and forth at high speed between two fixed limit positions. The bondhead slides on a frame. The chip gripper is mounted on bearings and can be moved in vertical direction relative to the bondhead. The frame is lowered for picking the semiconductor chip. As soon as the chip gripper impacts on the semiconductor chip, it is deflected relative to the bondhead whereby the deflection acts against a spring clamped between the chip gripper and the bondhead. The frame is also lowered for placing the semiconductor chip onto the substrate.

A linear guide suitable as a pick and place system is known from the European patent application EP 1 143 487 with which the bondhead can be guided back and forth between any two limit positions.

Two requirements are placed on the mounting process which, with today's systems, can only be fulfilled with great effort. On picking the semiconductor chip, the lowering of the bondhead or chip gripper should take place in the shortest time possible. However, the chip gripper must not impact on the semiconductor chip with too high speed as otherwise the semiconductor chip is damaged or even destroyed by the impact. Also, on placing the semiconductor chip onto the substrate, lowering should take place in the shortest time possible. In addition, the chip gripper should produce a predetermined bond force with which the semiconductor chip is pressed against the portion of adhesive applied to the substrate. While this bond force is relatively low for small semiconductor chips, for the processing of larger semiconductor chips relatively high bond forces are required. The bond force is determined by means of the degree of deflection of the spring clamped between the chip gripper and the bondhead. In order that the picking of the semiconductor chip can take place at a higher lowering speed of the chip gripper, the spring must be relatively soft in order to keep the impact sufficiently low. However, in order that the necessary bond force can be produced for larger semiconductor chips, the spring must be relatively hard as otherwise the deflection necessary to produce the required bond force would be too great.

BRIEF DESCRIPTION OF THE INVENTION

The object of the invention is to develop a pick and place system which not only enables a fast lowering of the chip gripper but can also produce a high bond force.

An apparatus in accordance with the invention for mounting semiconductor chips has a pick and place system arranged stationary in vertical direction for the pick-up, transport and placing of a semiconductor chip onto a substrate. The pick and place system comprises a bondhead with a chip gripper deflectable relative to the bondhead. The deflection of the chip gripper takes place by means of a pneumatic drive arranged on the bondhead which has two pressure chambers separated by a piston, whereby the chip gripper is attached to the piston. The pressure $p_1$ prevailing in the first pressure chamber and the pressure $p_2$ prevailing in the second pressure chamber are dynamically controlled by means of a regulator controlled valve system. The regulator can be operated in two operating modes. In the first operating mode, the deflection of the chip gripper and/or a variable derived from it, is controlled based on a signal delivered by a position encoder which measures the deflection of the chip gripper. In the second operating mode, the pressure $p_1$ and/or the pressure $p_2$ and/or the pressure differential $p_1$-$p_2$ is controlled.

In order to achieve a high dynamic response, valves manufactured in piezo technology or micromechanical valves made of silicon are preferably used.

In a further development of the pick and place system, the position of the lower edge of the picked semiconductor chip is measured by means of a light barrier arranged on the bondhead. The light beam of the light barrier runs in horizontal direction. The light barrier delivers a binary signal which indicates whether or not the light beam is interrupted. During picking of the semiconductor chip, the chip gripper is lowered and therefore the light beam is interrupted. After picking of the semiconductor chip, the chip gripper is raised so far that the light beam is no longer interrupted. At the instant where the binary output signal from the light barrier changes from "interrupted" to "not interrupted", the value of the position encoder is requested. In this way, it is possible to lower the semiconductor chip to a height dependent on its thickness.

The accompanying drawings, which are incorporated into and constitute a part of this specification, illustrate one or more embodiments of the present invention and, together with the detailed description, serve to explain the principles and implementations of the invention. The figures are not to scale.

BRIEF DESCRIPTION OF THE DRAWING FIGURES

Figure 1:
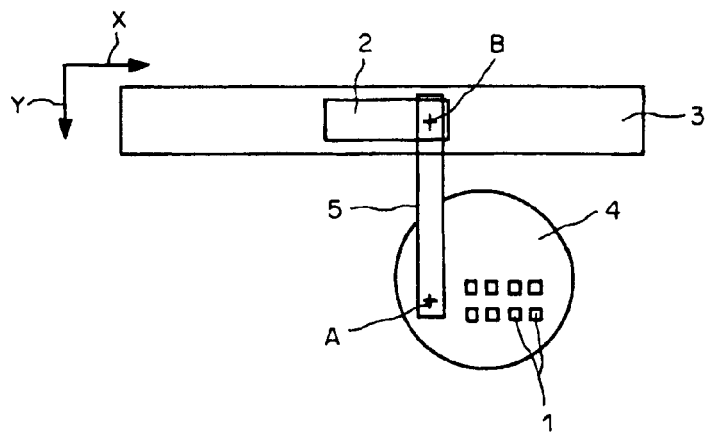
FIG. 1 shows a schematic plan view of a Die Bonder.

FIG. 1 shows a schematic plan view of a Die Bonder for the placing of semiconductor chips 1 onto a substrate 2. The three co-ordinate axes of a cartesian system of co-ordinates are marked with x, y and z, whereby the z axis corresponds to the vertical direction. The Die Bonder comprises a transport system 3 for the transport of the substrate in x direction and, optionally, also in y direction. A suitable transport system 3 is, for example, described in the European patent EP 330 831. The semiconductor chips 1 are preferably presented one after the other by a wafer table 4 at a location A. A pick and place system 5 picks the semiconductor chip 1 at location A and transports is to a location B above the substrate 2.

Figure 2:
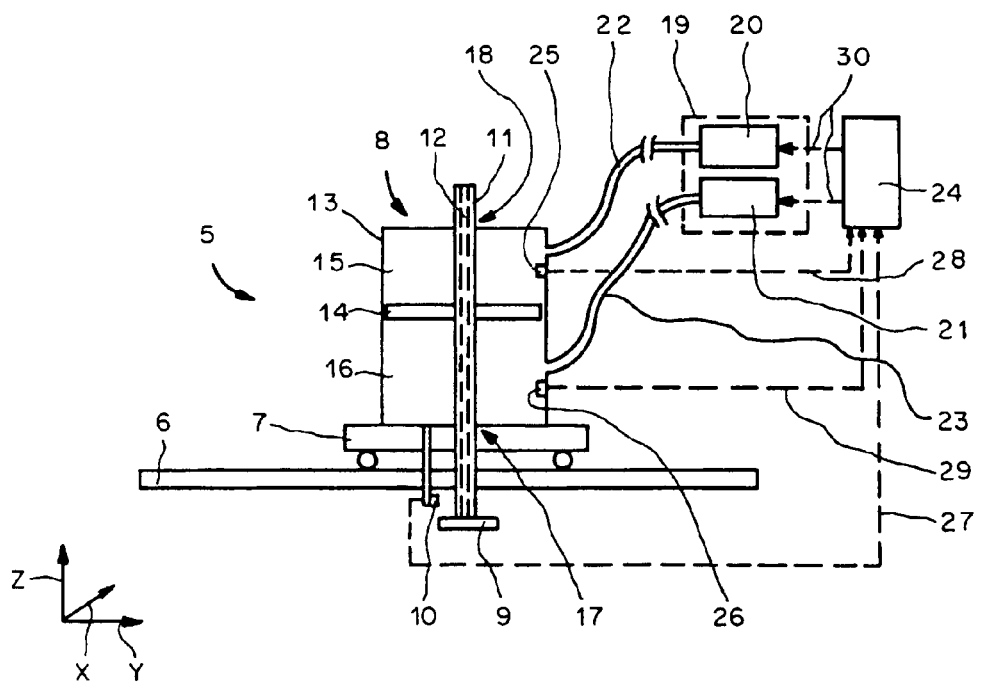
FIG. 2 shows a first embodiment of a pick and place system in accordance with the invention.

FIG. 2 shows a first embodiment of the pick and place system 5. The pick and place system 5 has a linear guide 6 for guiding the bondhead 7 in the y direction. The linear guide 6 is rigidly arranged in relation to the vertical z direction, ie, it can not be raised or lowered in z direction. A not presented drive moves the bondhead 7 back and forth on the linear guide 6 in y direction. Optionally, the linear guide 6 can be moved in x direction by means of a drive in order to be able to correct any position errors in x direction of the semiconductor chip to be mounted within a range of typically ±1.5 mm. A suitable linear guide 6 is known, for example, from the European patent application EP 923 111 or from the European patent application EP 1 143 487, however in the present case, it is to be developed rigidly in relation to the z direction.

The bondhead 7 comprises a chip gripper 9 driven by a pneumatic drive 8 deflectable in z direction, ie, in vertical direction and a position encoder 10 for measurement of the deflection of the chip gripper 9 relative to the bondhead 7 in z direction. The stroke, ie, the maximum deflection, of the chip gripper 9 should be kept as small as possible. The z height of the wafer table 4 should therefore be adjusted so that the semiconductor chips 1 are picked at the same z height as that at which they are placed onto the substrate 2. In this way, a stroke of only around 5 mm can be achieved. For special applications, for example where the substrate 2 is located within an oven, the stroke is greater and can amount to up to 20 mm. The chip gripper 9 comprises a rod 11 onto the lower end of which a removable pick-up tool adapted to the semiconductor chip 1 is secured. The rod 11 has a longitudinal drill hole 12 to which vacuum can be applied for holding the semiconductor chip 1. The pneumatic drive 8 comprises a cylindrical shaped housing 13 secured to the bondhead 7 with two pressure chambers 15 and 16 separated by a piston 14. The rod 11 of the chip gripper 9 bears in drill holes 17 and 18 of the housing 13 and is secured to the piston 14 so that it moves with the piston 14 in z direction. Control of the pressure $p_1$ prevailing in the first pressure chamber 15 and the pressure $p_2$ prevailing in the second pressure chamber 16 is achieved by means of a valve system 19 which comprises, for example, two two-way valves 20 and 21. The first pressure chamber 15 is connected to the first two-way valve 20 via a line 22, the second pressure chamber 16 is connected to the second two-way valve 21 via a line 23. The two two-way valves each have an inlet to which compressed air is supplied and an inlet to which ambient air or vacuum is supplied as well as one outlet to which line 22 or 23 is connected. The valve system 19 comprising the two valves 20 and 21 is controlled by a regulator 24. A first pressure sensor 25 serves to measure the pressure $p_1$ prevailing in the first pressure chamber 15, a second pressure sensor 26 serves to measure the pressure $p_2$ prevailing in the second pressure chamber 16. The output signals 27, 28 and 29 of the position encoder 10 or of the two pressure sensors 25 and 26 are supplied to the regulator 24 as input variables. The regulator 24 delivers control signals 30 for controlling the valve system 19, in the example therefore, two control signals 30 for control of the two two-way valves 20 and 21.

Such a two-way valve can, for example, comprise two separate valves the outlets of which are connected and together form the outlet of the two-way valve. In this case, the regulator 24 delivers four control signals 30 for controlling the four valves.

Valves 20 and 21 are either arranged on the bondhead 7 and move together with the bondhead 7 or they are arranged stationary as presented.

The pressure differential $p_1$-$p_2$ produces a force proportional to the cross-sectional area of the piston 14 which acts on the piston 14 and therefore causes the movement and deflection of the chip gripper 9. Via the first two-way valve 20, either compressed air can be supplied to the first pressure chamber 15 in order to increase the pressure $p_1$ in the first pressure chamber 15 or the first pressure chamber 15 can be evacuated in order to lower the pressure $p_1$. The same is applicable for the second two-way valve 21 and the second pressure chamber 16.

The regulator 24 works in two operating modes. In the first operating mode, the deflection of the chip gripper 9, that means the z position, or a variable derived from it is controlled. The position encoder 10 continuously acquires the deflection $z_{actual}(t)$ as a function of time t and the regulator 24 controls the two-way valves 20 and 21 according to a given characteristic $z_{set}(t)$. In the second operating mode, the pressure differential $p_1$-$p_2$ is controlled which produces the bond force to be produced by the chip gripper 9. Adapted to the desired Pick or Place process, the regulator 24 is given additional marginal conditions in particular those which affect the transition from the first operating mode to the second operating mode. In the following, some processes are described as examples.

Figure 3:
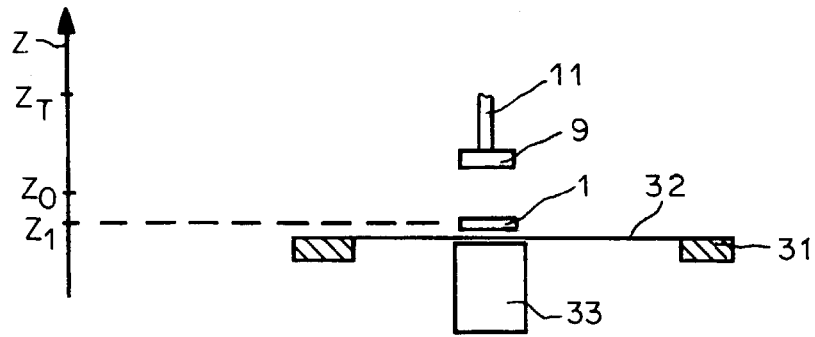
FIG. 3 shows a pick process.

1. Lowering the chip gripper for picking a semiconductor chip from the wafer table The lowering of the chip gripper 9 takes place in three phases and is explained based on FIG. 3. The semiconductor chip 1 sticks to a foil 32 held in a frame 31. The frame 31 is secured to the wafer table 4 (FIG. 1). A so-called die ejector 33, which supports the Pick process, is located underneath the semiconductor chip 1 to be processed. The z co-ordinate designates the deflection of the chip gripper 9 relative to the bondhead 7 as measured by the position encoder 10. In the first phase, the chip gripper 9 is lowered with the greatest possible speed as far as a predefined height $z_0$. The height $z_0$ is defined so that the chip gripper 9 does not yet touch the semiconductor chip 1 to be picked. In doing so, it must be observed that the height $z_1$ of the surface of the semiconductor chip 1 facing towards the chip gripper 9 is subject to certain when minor deviations. During the second phase, which begins by travelling through the height $z_0$, the chip gripper 9 is lowered at a constant speed v1 with the aim of maintaining the impact of the chip gripper 9 on the semiconductor chip 1 within controlled limits. On the one hand, the impact should be small which demands a low speed, on the other hand, the pick process should not take too long which speaks against a low speed. The speed $v_1$ must be defined accordingly. Control of the z position takes place in the first phase therefore with the marginal condition that, on reaching the height $z_0$, the chip gripper 9 already demonstrates the speed $v_1$ and a disappearing acceleration. When the chip gripper 9 comes into contact with the semiconductor chip 1, then the semiconductor chip 1 offers resistance to the lowering of the chip gripper 9. As a result, a pressure pulse is created in the two pressure chambers 15 and 16 which can be detected as touchdown by means of the two pressure sensors 25 and 26. The third phase begins on detection of the touchdown: The regulator 24 switches to the second operating mode and builds up the pressure differential corresponding to the force which should be applied to the semiconductor chip 1 on picking.

On picking, the semiconductor chip 1 must be detached from the foil 32. Detachment can be supported in various ways. Common is detachment by means of a needle which penetrates the foil 32 from underneath and slightly raises the semiconductor chip 1 so that the foil 32 detaches itself from the semiconductor chip 1. With this process, the volumes of the two pressure chambers 15 and 16 change however the pressure differential $p_1-p_2$ is kept constant by the regulator 24. Known is also the detachment of the foil 32 without the help of a needle in that the foil is pulled away from the underneath of the semiconductor chip 1 by means of vacuum.

As soon as the detachment of the foil 32 from the semiconductor chip 1 is sufficiently concluded, the regulator 24 switches back to the first operating mode in order to raise the chip gripper 9 as quickly as possible to a predefined height $z_T$.

2. Placing a relatively large semiconductor chip onto the substrate

The lowering of the chip gripper 9 takes place in two phases. In the first phase, the chip gripper 9 is lowered in the shortest possible time to a predefined height $z_2$. In doing so, the regulator 24 is in the first operating mode in which it controls the deflection z(t). On reaching the height $z_2$, the regulator 24 is switched to the second operating mode in which it builds up and controls the bond force to be produced. In order to achieve a smooth transition from the position control to bond force control, the control parameters in the first phase are predetermined as far as possible so that, on reaching height $z_2$, the pressure differential $p_1-p_2$ corresponding to the bond force to be produced is achieved.

3. Placing a relatively small semiconductor chip onto the substrate

With small semiconductor chips, a lower bond force is necessary which can even be less than the weight of the chip gripper 9 itself. The lowering of the chip gripper 9 again takes place in two phases. In the first phase, the chip gripper 9 is lowered in the shortest possible time to a predetermined height $z_2$. The control parameters are predefined so that on running through the height $z_2$, first the speed of the chip gripper 9 has a predetermined value and, secondly, the pressure differential $p_1-p_2$ produces a minute force of, for example, only 0.03 N. The second phase begins on reaching the height $z_2$ and finishes a predetermined period of time τ later, when the chip gripper 9 is raised. During the second phase, the chip gripper 9 with the semiconductor chip 1 firstly falls in the air until it impacts on the adhesive and then lowers further until the chip gripper 9 is raised at the end of the second phase. The vacuum at the tip of the chip gripper 9 must be released at the right time so that the semiconductor chip 1 remains on the adhesive when the chip gripper 9 is raised. The height $z_2$ is predefined so that the semiconductor chip 1 still travels around 0.5 mm in the second phase.

The processes described for the picking and placement of the semiconductor chips are to be understood as embodiments which should illustrate the operation of the pick and place system in accordance with the invention and the achieved advantages. With this pick and place system however, other processes can also be carried out with which the picking and placing of the semiconductor chips is optimised even further.

Proportional valves are preferably used as valves. Because the movement of the chip gripper 9 has to take place with a high dynamic response, the proportional valves must be capable of following the changes given by the control signal of the regulator 24, even when the frequency range of the control signal has portions in the range above 100 Hz, typically up to 300 Hz. This requirement is fulfilled, for example, by proportional valves which are based on the piezo technology.

The acceleration of the chip gripper 9 or the piston 14 is proportional to the pressure differential $p_1-p_2$. In order to lower the chip gripper 9 from the transport height $z_T$ to height $z_0$, either the pressure $p_1$ in the first chamber 15 must be increased or the pressure $p_2$ in the second chamber 16 must be decreased. It is advantageous to increase the pressure $p_1$ and decrease the pressure $p_2$ simultaneously so that lowering can take place as quickly as possible. In addition, because the pressure reduction takes place more slowly than the pressure increase, it is advantageous to operate both pressure chambers 15 and 16 at a high pressure level. That means, with the piston 14 in the neutral position, on supplying the valves with 4 bar the pressure $p_1$ and pressure $p_2$ amount typically to around 3 to 3.5 bar.

Therefore, the regulator 24 is preferably adjusted so that it operates the two pressure chambers 15 and 16 at the highest possible pressure level;

for an increase in the pressure differential p1-p2, it increases the pressure p1 and, as far as possible, simultaneously reduces the pressure p2;

for a reduction in the pressure differential p1-p2, it reduces the pressure p1 and, as far as possible, simultaneously increases the pressure p2; and on the position controlled approach to a predetermined position $z_0$, it controls the pressure differential $p_1-p_2$ so that the necessary pressure differential is achieved on reaching the deflection $z_0$ at which it switches from position control to pressure differential control.

It is advantageous when both pressure chambers 15 and 16 are dynamically controlled. However, it is also possible to maintain a constant pressure in one of the two pressure chambers 15 or 16 and only dynamically control the pressure in the other one of the two pressure chambers 15 or 16.

Figure 4:
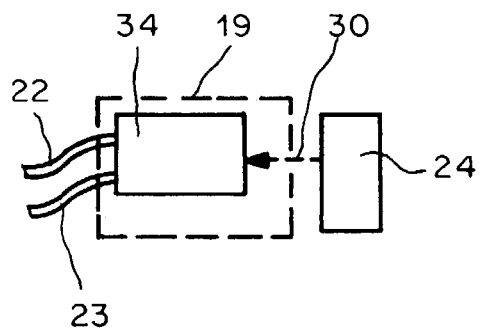
FIG. 4 shows a valve system with a regulator.

FIG. 4 shows a valve system 19 which comprises one single four-way valve 34 and the regulator 24. The four-way valve 34 has one inlet to which compressed air is supplied and one inlet to which ambient air or vacuum is supplied, as well as two outlets to which the lines 22 and 23 are connected. The four-way valve 34 is, for example, a proportional valve with which one single piston controls the pressures $p_1'$ and $p_2'$ prevailing at the outlets: The pressures $p_1'$ and $p_2'$ are linked together in such a way that the pressure $p_2'$ at the second outlet reduces when the pressure $p_1'$ at the first outlet increases. Therefore, for control of the pressures $p_1$ or $p_2$ measured by the pressure sensors 25 and 26, the regulator 24 only has to produce one single control signal.

Figure 5:
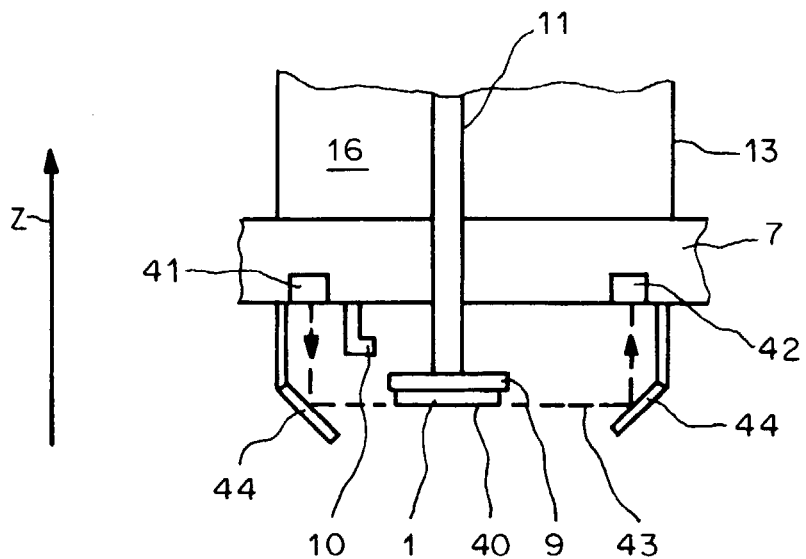
FIG. 5 shows a bondhead with a light barrier.

Because the pick and place system 5 only has one single movable z axis, the possibility arises of measuring the z height of the lower edge 40 of the picked semiconductor chip 1 in a simple way, for example by means of a light barrier. FIG. 5 shows a view of the bondhead 7 expanded with a light barrier. The light barrier comprises an opto-transmitter 41, eg, a light-emitting diode or an injection laser diode, and an opto-receiver 42. The light beam 43 of the light barrier runs in horizontal direction. For construction reasons, it is advantageous to arrange the opto-transmitter 41 and the opto-receiver 42 on the bondhead 7 so that the opto-transmitter 41 transmits a light beam 43 in vertical direction and the opto-receiver 42 detects light propagated in z direction, and to divert the light beam 43 in the horizontal direction by means of two tilted mirrors 44 or prisms. The light barrier delivers a binary signal which indicates whether or not the light beam 43 is interrupted.

During the back and forth movement of the bondhead from location A to location B, the chip gripper 9 is in a raised position above the light beam 43. For picking the semiconductor chip 1 presented on the wafer table 4 (FIG. 1), the chip gripper 9 is lowered whereby it interrupts the light beam 43. At the instant when the signal of the light barrier switches from "not interrupted" to "interrupted", the value $W_1$ of the signal delivered by the position encoder 10 is requested. After picking the semiconductor chip 1, the chip gripper 9 is raised. At the instant when the signal of the light barrier switches from "interrupted" to "not interrupted", the value $W_2$ of the signal delivered by the position encoder 10 is requested. This second value $W_2$ is a gauge for the z height of the lower edge 40 of the picked semiconductor chip 1. In event that the values $W_1$ and $W_2$ do not differ by more than a predetermined tolerance value, this means that picking has failed and that no semiconductor chip 1 is held on the chip gripper 9. In this case, picking is repeated and/or an alarm message is initiated.

With this measuring system, a further process is possible in order to place the semiconductor chip 1 onto the substrate 2: The chip gripper 9 is lowered to a z height which is dependent on the measured value $W_2$, namely to the height $z_2 = z_2' + W_{Set} - W_2$, whereby the height $z_2'$ designates a constant value and $W_{Set}$ designates a constant reference value for the set thickness of the semiconductor chip 1. After the height $z_2$ has been reached, the chip gripper 9 is raised again. On placing the semiconductor chip 1 with this process, the regulator 24 is therefore only operated in the first operating mode in which the z height is controlled. Small semiconductor chips can be lowered onto the adhesive on the substrate at the maximum speed allowed by the construction. Relatively large semiconductor chips on the other hand, must be placed somewhat slower as it must be ensured that the adhesive can spread uniformly underneath the semiconductor chip without the formation of air voids.

In the event that variations in the thickness of the substrate 2 are not inconsiderable, then it is advantageous that a further measuring system is present in order to measure the thickness D of the substrate 2. On placing the semiconductor chip 1, the chip gripper 9 is then lowered to the height $z_2 = z_2' + W_{Set} - W_2 + D_{Set} - D$, whereby the parameter $D_{Set}$ designates the set value of the substrate thickness.

Changes in the value $W_1$ indicate wear of the pick-up tool. In this way, the wear on the pick-up tool can be monitored by means of following the value $W_1$ and, on exceeding a predetermined value, a warning indication can be initiated.

In the following, further designs of the pick and place system 5 are described. The design of the pneumatic drive 8, the valves 20, 21 or 34 and the regulator 24 are however as described above.

Figure 6:
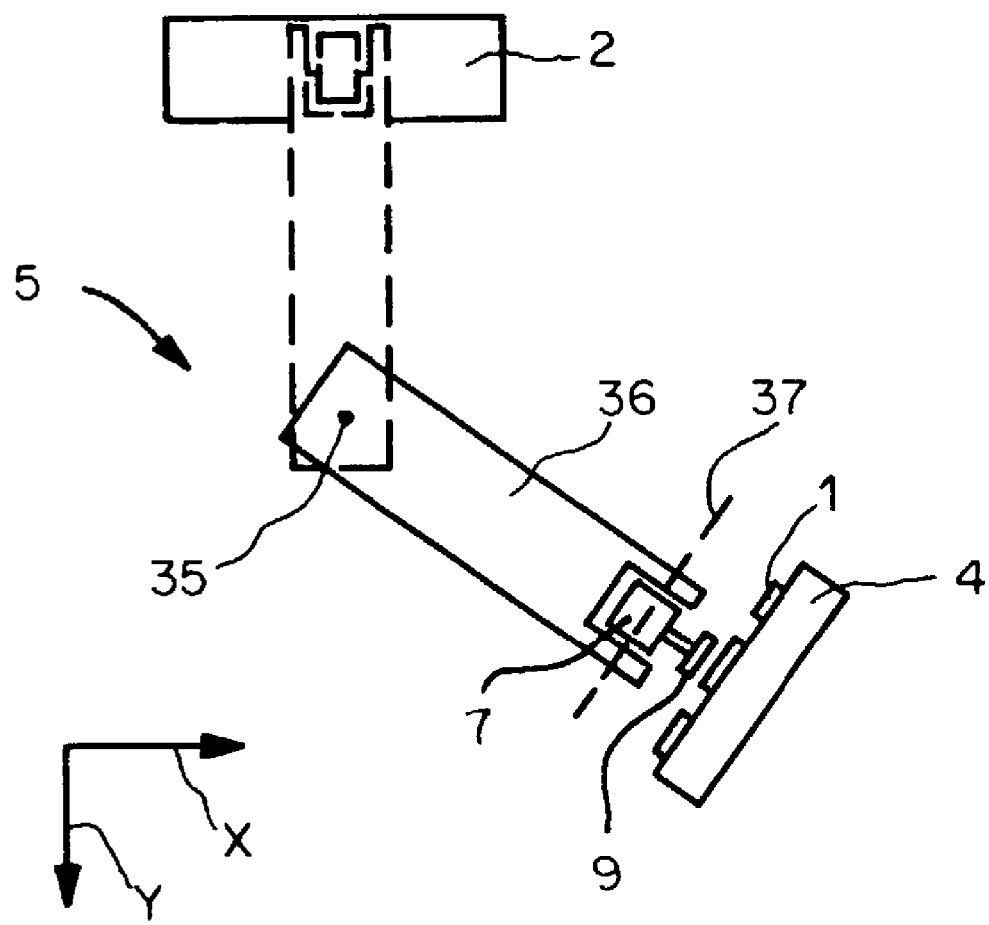
FIG. 6 shows a further embodiment of a pick and place system in accordance with the invention.

FIG. 6 shows a plan view of an embodiment with which the pick and place system 5 has a swivel arm 36, which can be swivelled back and forth on a vertical axis 35 between two limit positions, at one end of which the bondhead 7 is arranged. The swivel arm 36 serves to guide the bondhead 7 in the xy plane. The swivel arm 36 presented with an unbroken line is located at the first limit position. The second limit position of the swivel arm 36 is presented with a dashed line. The swivel arm 36 cannot be raised and lowered in the vertical z direction. The z height of the chip gripper 9 can therefore only be shifted by means of the pneumatic drive 8 (FIG. 2) arranged on the bondhead 7.

With a first version, the semiconductor chips 1 are presented on a vertically arranged wafer table 4 and, as is customary, are placed onto a horizontally presented substrate 2. The bondhead 7 can therefore be rotated by 90° on a horizontal axis 37. To pick the presented semiconductor chip 1, the swivel arm 36 is swivelled to the first limit position and the bondhead 7 turned on the axis 37 so that the chip gripper 9 can be deflected in horizontal direction on actuation of the pneumatic drive 8 in order to pick the presented semiconductor chip 1. After picking the semiconductor chip 1, the swivel arm 36 is swivelled to the other limit position and the bondhead 7 turned by 90° on the axis 37 so that the chip gripper 9 can place the semiconductor chip 1 onto the substrate 2.

With a second version, the semiconductor chips 1 are presented on a horizontally arranged wafer table 4. In this case, the axis 37 is omitted and with it the rotating of the bondhead on the axis 37.

For controlling the chip gripper 9 for the picking and placing of the semiconductor chip 1, the process which is described above can, for example, be used.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

The invention claimed is:

1. Apparatus for mounting semiconductor chips, with a pick and place system for pick-up, transport and placement of a semiconductor chip onto a substrate, the pick and place system comprising a bondhead, the bondhead including:
   a chip gripper, the chip gripper being deflectable in relation to the bondhead,
   a pneumatic drive for controlling a deflection of the chip gripper, the pneumatic drive being formed from two pressure chambers separated by a piston,
   a position encoder for measuring the deflection of the chip gripper, the apparatus further comprising:
   a valve system for controlling a pressure $p_1$ prevailing in the first pressure chamber and a pressure $p_2$ prevailing in the second pressure chamber,
   a first pressure sensor for measuring the pressure $p_1$ prevailing in the first pressure chamber,
   a second pressure sensor for measuring the pressure $p_2$ prevailing in the second pressure chamber, and
   a regulator operable in two operating modes for controlling the valve system, the first operating mode controlling the deflection of the chip gripper or a variable derived from the deflection and the second operating mode controlling the first pressure $p_1$ and the second pressure $p_2$ or the second operating mode controlling the pressure differential $p_1 - p_2$.

2. Apparatus according to claim 1, the bondhead further comprising a light barrier for determining a position of a lower edge of a picked semiconductor chip.

3. Apparatus according to claim 1, the pick and place system including a linear guide for guiding a back and forth movement of the bondhead, the linear guide being arranged stationary relative to a deflection direction of the chip gripper.

4. Apparatus according to claim 2, the pick and place system including a linear guide for guiding a back and forth movement of the bondhead, the linear guide being arranged stationary relative to a deflection direction of the chip gripper.

5. Apparatus according to claim 1, the pick and place system including a swivel arm swivelling on a vertical axis between two limit positions wherein the swivel arm cannot be moved in a vertical direction.

6. Apparatus according to claim 2, the pick and place system including a swivel arm swivelling on a vertical axis between two limit positions wherein the swivel arm cannot be moved in a vertical direction.

7. Apparatus according to claim 1, the valve system comprising valves produced with the piezo technology or micromechanical valves made of silicon.

8. Apparatus according to claim 2, the valve system comprising valves produced with the piezo technology or micromechanical valves made of silicon.

9. Apparatus according to claim 3, the valve system comprising valves produced with the piezo technology or micromechanical valves made of silicon.

10. Apparatus according to claim 4, the valve system comprising valves produced with the piezo technology or micromechanical valves made of silicon.

11. Apparatus according to claim 5, the valve system comprising valves produced with the piezo technology or micromechanical valves made of silicon.

12. Apparatus according to claim 6, the valve system comprising valves produced with the piezo technology or micromechanical valves made of silicon.

* * * * *